United States Patent
Kutz et al.

(10) Patent No.: US 7,634,703 B2
(45) Date of Patent: Dec. 15, 2009

(54) **LINEAR APPROXIMATION OF THE MAX\* OPERATION FOR LOG-MAP DECODING**

(75) Inventors: Gideon Kutz, Herzelia (IL); Amir I. Chass, Herzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 444 days.

(21) Appl. No.: 10/596,205

(22) PCT Filed: Dec. 3, 2004

(86) PCT No.: PCT/IB2004/004420

§ 371 (c)(1),
(2), (4) Date: Aug. 7, 2006

(87) PCT Pub. No.: WO2005/055435

PCT Pub. Date: Jun. 16, 2005

(65) Prior Publication Data

US 2007/0168820 A1    Jul. 19, 2007

(30) Foreign Application Priority Data

Dec. 5, 2003    (GB) ................. 0328322.3

(51) Int. Cl.
*H03M 13/00*    (2006.01)
(52) U.S. Cl. ..................... 714/755; 708/277
(58) Field of Classification Search ........... 714/755; 708/277

See application file for complete search history.

(56) References Cited

U.S. PATENT DOCUMENTS

| | | | | |
|---|---|---|---|---|
| 6,757,701 | B2 * | 6/2004 | Sivan et al. | 708/277 |
| 6,922,711 | B2 * | 7/2005 | Kato et al. | 708/277 |
| 6,993,703 | B2 * | 1/2006 | Miyauchi | 714/794 |
| 7,032,156 | B2 * | 4/2006 | Yu et al. | 714/755 |
| 2002/0018533 | A1 | 2/2002 | Sivan et al. | |
| 2003/0053566 | A1 * | 3/2003 | He et al. | 375/340 |

FOREIGN PATENT DOCUMENTS

EP    1189355  B1    10/2003

OTHER PUBLICATIONS

Wu et al "Internal Data Width in SISO Decoding Module with Modular Renormalization" IEEE 51st Vehicular Technology Conference, Tokyo, Japan, vol. 1 of 3, Conf 51, May 2000 pp. 675-679.

Cheng et al "Linearly Approximated Log-Map Algorithms for Turbo Decoding" IEEE 51st Vehicular Technology Conference, Tokyo, Japan, vol. 1 of 3, Conf 51, May 2000 pp. 2252-2256.

\* cited by examiner

*Primary Examiner*—Guy J Lamarre
*Assistant Examiner*—Sam Rizk

(57) ABSTRACT

A decoder for a wireless communication device comprising a calculator for calculating the modulo of a linear approximation of a MAX\* function; and a selector for selecting a MAX\* output value from the group a(n)mod F, b(n)mod F, and the calculated modulo based upon a determination as to whether a predetermined threshold value for |a(n)−b(n)| has been met, where a(n) is a first state metric, b(n) is a second state metric, C is the predetermined threshold value and F is a value greater than |a(n)−b(n)|.

9 Claims, 1 Drawing Sheet

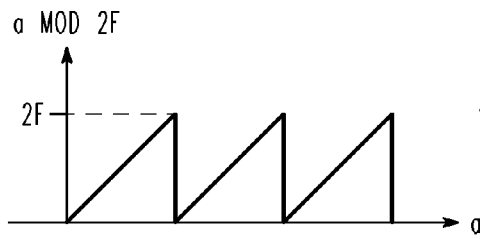
FIG. 1
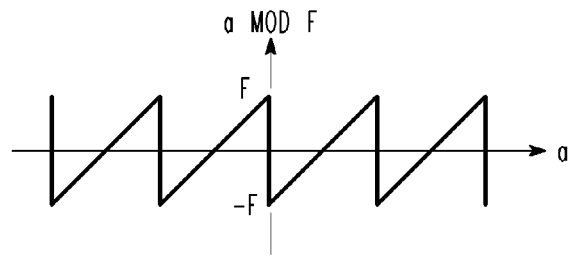
FIG. 2
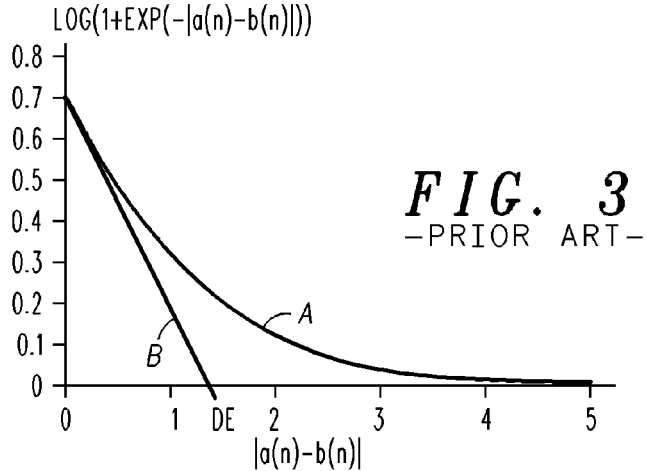
FIG. 3
—PRIOR ART—
FIG. 4
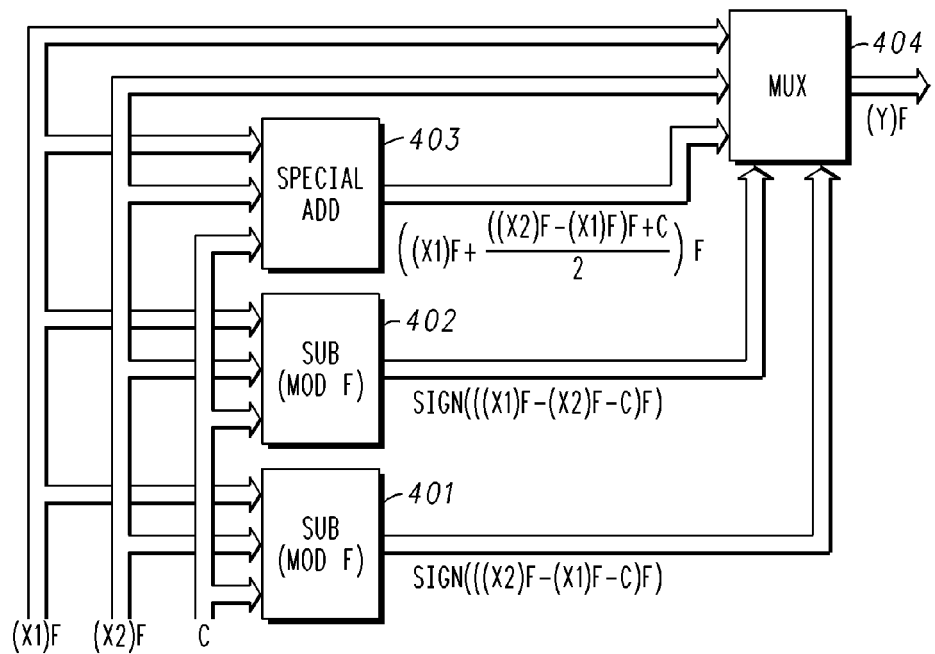

LINEAR APPROXIMATION OF THE MAX* OPERATION FOR LOG-MAP DECODING

CROSS-REFERENCE TO RELATED APPLICATIONS

This application claims the benefit of United Kingdom patent application no. 0328322.3.

FIELD OF THE INVENTION

The present invention relates to a decoder for a wireless communication device.

BACKGROUND OF THE INVENTION

Wireless communication systems are widely deployed to provide various types of communications such as voice and data. One such system is wideband code division multiple access WCDMA, which has been adopted in various competing wireless communication standards, for example $3^{rd}$ generation partnership project 3GPP and 3GPP2.

To overcome data corruption that can occur during RF transmission the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment.

A turbo encoder includes two convolutional encoders and an interleaver, where the interleaver shuffles (i.e. interleaves) the information bits in the packet in accordance with a specified interleaving scheme.

The turbo encoder uses a first convolutional encoder to encode information bits within a packet to generate a first sequence of parity bits in parallel to the interleaver shuffling the information bits, where the shuffled information bits are encoded by a second encoder to generate a second sequence of parity bits. The information bits and the parity bits in the first and second sequence are then modulated and transmitted to a receiver.

The information bits and the first and second sequence of parity bits are received by a receiver and decoded by a turbo decoder.

The turbo decoder initially stores the received information bits and the parity bits in the first and second sequence in a buffer. Initially, the information bits and the first sequence of parity bits from the first convolutional encoder are retrieved from the buffer and decoded by a first soft input soft output SISO decoder to provide 'extrinsic' information indicative of adjustments in the confidence in the detected values for the information bits. Intermediate results that include the extrinsic information from the first SISO decoder are then stored in the buffer in an interleaved order matching the code interleaving used at the transmitter.

The intermediate results, the information bits and the second sequence of parity bits from the second encoder are retrieved from the buffer and decoded by a second SISO decoder to provide extrinsic information indicative of further adjustments in the confidence in the detected values for the information bits. Intermediate results that comprise the extrinsic information from the second SISO decoder are then stored in the buffer in a deinterleaved order complementary to the code interleaving performed at the transmitter. The intermediate results are used in a next decoding iteration performed by the turbo decoder. The turbo decoder performs a predetermined number of decoding iterations before producing a decision on the value of the decoded information bit.

Commonly used algorithms used within SISO decoders are the maximum a posteriori MAP decoding algorithm and the log MAP decoding algorithm. The log MAP decoding algorithm is analogues to the MAP decoding algorithm but performed in the logarithmic domain.

The MAP decoding algorithm uses forward state metrics, commonly referred to as alphas $\alpha$, and backward state metrics, commonly referred to as betas $\beta$, to determine soft output results, where the forward state metrics $\alpha$ and backward state metrics $\beta$ characterise a state in a trellis structure.

The MAX* function is used within the log-MAP algorithm and is represented by MAX*(a(n),b(n)), where a(n) and b(n) are inputs to the MAX* function. The inputs a(n) and b(n) can be forward state metrics, backward state metrics or a combination of both.

The MAX*(a(n),b(n)) function is equal to MAX(a(n),b(n)) plus a correction value where the correction value is equal to log(1+exp(−|a(n)−b(n)|)).

The MAX(a(n),b(n)) term of the equation is usually straight forward to calculate, however the correction value is relatively complicated to calculate and is usually approximated using either a linear approximation, a step approximation or a look-up table.

As the state metric calculations are performed within the SISO decoder the values within the accumulated path metrics can overflow leading to incorrect results.

One solution to the overflow problem involves the use of modulo arithmetic's. A modulo n operation on a number provides the remainder when the number is divided by n, for example 10(binary 1010)modulo 8=2(binary 010) and 28(binary 11100)modulo 16=12(binary 1100). Consequently, as can be seen from the examples, determine a value for a modulo operation where the remainder is a value to the power of two is simply a question of masking off any unwanted bits.

The modulo function, as illustrated in FIG. 1, can be regarded as a sawtooth function.

An alternative implementation of the modulo function can be defined by:

$$x \bmod F = x - 2F\left\lfloor\left(\frac{x+F}{2F}\right)\right\rfloor,$$

which allows negative numbers to be accommodated. This function is illustrated in FIG. 2.

It is desirable to have an apparatus and method for generating a linearly approximated MAX* log MAP algorithm that operates on modulo functions.

BRIEF DESCRIPTION OF THE DRAWINGS

An embodiment of the invention will now be described, by way of example, with reference to the drawings, of which:

FIG. 1 illustrates a graphical representation of a first modulo function;

FIG. 2 illustrates a graphical representation of a second modulo function;

FIG. 3 illustrates a graphical representation of the variation in the MAX* correction term versus |a(n)−b(n)|;

FIG. 4 illustrates a decoder according to an embodiment of the present invention.

DETAILED DESCRIPTION

The curve A in FIG. 3 illustrates the correction term for the MAX*(a(n),b(n)) function (i.e. MAX*(a(n),b(n))−MAX(a(n),b(n)) as a function of |a(n)−b(n)|, where |a(n)−b(n)| is the absolute value of the difference between a(n) and b(n)).

As can be seen from curve A the correction term is greatest for low values of |a(n)−b(n)| and gradually decreases to zero as |a(n)−b(n)| increases.

As stated above, an easy technique for approximating the correction term is the use of linear approximation, as illustrated by line B in FIG. 3. As illustrated, the linear approximation provides a close approximation for the correction term for low values of |a(n)−b(n)|. The intersection of the line B on the |a(n)−b(n)| axis indicates the |a(n)−b(n)| value above which the linear approximation correction term goes to zero. Consequently, using linear approximation, the intersection point determines a threshold value, designated C, for determining if a correction value is to be applied to |a(n)−b(n)|, where the intersection point is defined by the linear approximation equation.

The use of the linear approximation technique allows easy calculation of the MAX* function, as described below.

One suitable linear approximation equation (i.e. the correction term used) is given by MAX(0, (C−|a(n)−b(n)|)/2).

Consequently, the MAX* function can be written as:

$$\begin{aligned}\text{MAX}(a(n), b(n)) + \\ \text{MAX}\left(0, \frac{(C - |a(n) - b(n)|)}{2}\right) &= \text{MAX}\Big(0 + \text{MAX}(a(n), b(n)), \\ &\quad \frac{(C - |a(n) - b(n)|)}{2} + \text{MAX}(a(n), b(n))\Big) \\ &= \text{MAX}\left(a(n), b(n), \frac{(C - |a(n) - b(n)|)}{2} + \text{MAX}(a(n), b(n))\right) \\ &= \text{MAX}\left(a(n), b(n), \frac{(a(n) + b(n) + C)}{2}\right)\end{aligned}$$

To minimise the problem of accumulated state metric overflow, as discussed above, the above terms are converted into their corresponding 'mod F' values where F is selected such that |a(n)−b(n)|<F. F is chosen by analysing the algorithm and determining what would be the maximum possible value of |a(n)−b(n)| for any a(n) and b(n) that can enter the MAX* function.

To ease the hardware implementation for handling the modulo value F is preferable a value to the power of two.

The mod F of a(n) becomes a(n)mod F.
The mod F of b(n) becomes b(n)mod F.
However, the mod F of (a(n)+b(n)+C)/2 is $$\left(a(n) \bmod F + \frac{(b(n) \bmod F - a(n) \bmod F) \bmod F + C}{2}\right) \bmod F$$

and not $\left(\frac{a(n) \bmod F + b(n) \bmod F + C}{2}\right) \bmod F.$

This is demonstrated by the following:
The equation x mod F is equivalent to $$x - 2F\left\lfloor\left(\frac{x+F}{2F}\right)\right\rfloor,$$

where the $\lfloor x \rfloor$ term is the floor of 'x'.
Accordingly:

$(a(n)+C) \bmod F = (a(n) \bmod F + C) \bmod F$ and $(a(n)-b(n)) \bmod F = a(n)-b(n)$ if and only if $|a(n)-b(n)| < F$ Using these two identities proves:

$$\begin{aligned}\left(\frac{a(n) + b(n) + C}{2}\right) \bmod F &= \left(a(n) + \left(\frac{b(n) - a(n) + C}{2}\right)\right) \bmod F \\ &= (a(n) \bmod F + \\ &\quad \left(\frac{(b(n) - a(n)) \bmod F + C}{2}\right)) \bmod F \\ &= (a(n) \bmod F + \\ &\quad \frac{((b(n) \bmod F - a(n) \bmod F) \bmod F + C)}{2}) \\ &\quad \bmod F.\end{aligned}$$

For values of C<F/2 an alternative implementation of the modulo of a linear approximation of a MAX function is equal to:

$$\left(\left(\frac{(a(n) \bmod F + C) \bmod F + b(n) \bmod F}{2}\right) \bmod F + F * s\right) \bmod F$$

where s is calculated from the binary expression s=[a(m) xor b(m)] and [((a(m) xor a(m−1)) and ((b(m) xor b(m−1)], where a and b are represented by m bits so that a(m) is the most significant bit of a and a(m−1) is next to the most significant bit.

This algorithm is easy to calculate in silicon as s involves only binary operations and F is chosen to be a power of two.

A decoder 400 for implementing the above MAX* equation is shown in FIG. 4 and is arranged to output MAX(a(n) mod F, b(n)mod F) when |a(n)−b(n)| is greater than the threshold value C and to output $$\left(a(n) \bmod F + \frac{((b(n) \bmod F - a(n) \bmod F) \bmod F + C)}{2}\right) \bmod F$$

when |a(n)−b(n)| is less than the threshold value C. If |a(n)−b(n)| equals C then either MAX(a(n)mod F, b(n)mod F) or $$\left(a(n) \bmod F + \frac{((b(n) \bmod F - a(n) \bmod F) \bmod F + C)}{2}\right) \bmod F$$

can be output.

The decoder 400 includes a first subtracting unit 401, a second subtracting unit 402, a calculator 403 in the form of an adder unit and a selector 404 in the form of a multiplexer unit. The first subtracting unit 401, the second subtracting unit 402 and the adder unit 403 are each arranged to receive a(n)mod F, b(n)mod F and the threshold value C.

The first subtracting unit 401 is arranged to generate the sign of (b(n)mod F−a(n)mod F−C)mod F. The second subtracting unit 402 is arranged to generate the sign of (a(n)mod F−b(n)mod F−C)mod F. The adder unit 403 is arranged to generate $$\left(a(n) \bmod F + \frac{((b(n) \bmod F - a(n) \bmod F) \bmod F + C)}{2}\right) \bmod F,$$

where the division by two corresponds to a shift in bit position by one.

The mod F operation is performed by ignoring the overflow (i.e. the carry bit of the msb bit addition is ignored).

The output from the first subtracting unit 401, the second subtracting unit 402 and the adding unit 403 (i.e. the sign of (b(n)mod F−a(n)mod F−C)mod F, the sign of (a(n)mod F−b(n)mod F−C)mod F and $$\left(a(n) \bmod F + \frac{((b(n) \bmod F - a(n) \bmod F) \bmod F + C)}{2}\right)$$

mod F respectively)

are provided to the multiplex unit 404 along with the values of a(n)mod F and b(n)mod F.

The multiplexer 404 is arranged to output a MAX*(a(n) mod F, b(n)mod F) equal to a(n)mod F when the sign of (a(n)mod F−b(n)mod F−C)mod F is positive and the sign of (b(n)mod F−a(n)mod F−C)mod F is negative.

The multiplexer 404 is arranged to output a MAX*(a(n) mod F, b(n)mod F) equal to b(n)mod F when the sign of (a(n)mod F−b(n)mod F−C)mod F is negative and the sign of (b(n)mod F−a(n)mod F−C)mod F is positive.

The multiplexer 404 is arranged to output a MAX*(a(n) mod F, b(n)mod F) equal to $$\left(a(n) \bmod F + \frac{((b(n) \bmod F - a(n) \bmod F) \bmod F + C)}{2}\right) \bmod F$$

when the sign of (a(n)mod F−b(n)mod F−C)mod F is negative and the sign of (b(n)mod F−a(n)mod F−C)mod F is negative.

It will be apparent to those skilled in the art that the disclosed subject matter may be modified in numerous ways and may assume many embodiments other than the preferred forms specifically set out as described above, for example the above embodiments could be arranged such that the modulo for other linear approximation equations can be calculated and an additional subtracting unit could be used to determine the sign of a(n)−b(n) to assist the selection process.

The invention claimed is:

1. A decoder for a wireless communication device comprising:
   a calculator for calculating the modulo of a linear approximation of a MAX* function using:

$$\left(a(n) \bmod F + \frac{((b(n) \bmod F - a(n) \bmod F) \bmod F + C)}{2}\right) \bmod F;$$

and
   a selector for selecting a MAX* output value from the group a(n)mod F, b(n)mod F, and the calculated modulo based upon a determination as to whether a predetermined threshold value for |a(n)−b(n)| has been met, where a(n) is a first state metric, b(n) is a second state metric, C is the predetermined threshold value and F is a value greater than |a(n)−b(n)|; wherein
   the decoder is arranged to receive an information bit and to use the selected MAX* output value to decode the received information bit.

2. A decoder according to claim 1, wherein the calculator is arranged to calculate the modulo of the linear approximation of the MAX* function using:

$$\left(\left(\frac{(a(n) \bmod F + C) \bmod F + b(n) \bmod F}{2}\right) \bmod F + F * s\right) \bmod F,$$

where s is equal to [a(m) XOR b(m)] AND [((a(m) XOR a(m−1)) and ((b(m) XOR b(m−1)] and a(m) b(m) a(m−1) and b(m−1) are the most significant bits of a(n) b(n) a(n−1) and b(n−1) respectively.

3. A decoder according to claim 1, wherein the determination is based upon the sign of (a(n)mod F−b(n)mod F−C)mod F and the sign of (b(n)mod F−a(n)mod F−C)mod F.

4. A decoder according to claim 1, wherein the selector is arranged to select and output the modulo of the linear approximation of the MAX* function if the value |a(n)−b(n)| is less than the predetermined threshold value.

5. A decoder according to claim 1, wherein the value of F is to the power of two.

6. A decoder according to claim 1, wherein the selector is a multiplexer.

7. A decoder according to claim 1, wherein the calculator is an add module that is arranged to receive a(n)mod F, b(n)mod F and C.

8. A method of decoding an information bit by a decoder using a MAX* value, the method comprising:
   receiving an information bit by the decoder;
   receiving by a selector, a first modulo state metric a(n)mod F, a second modulo state metric b(n)mod F and a predetermined threshold value C for |a(n)−b(n)|, where F is a value greater than |a(n)−b(n)|;
   calculating by a calculator, the modulo of a linear approximation of a MAX* function using:

$$\left(a(n) \bmod F + \frac{((b(n) \bmod F - a(n) \bmod F) \bmod F + C)}{2}\right) \bmod F;$$

selecting by the selector, a value from the group a(n)mod F, b(n)mod F, and the calculated modulo based upon a determination as to whether the predetermined threshold value C for |a(n)−b(n)| has been met; and decoding by the decoder, the received information bit using the selected value.

9. A method according to claim 8, wherein the modulo of the linear approximation of the MAX* function is calculated using:

$$\left(\left(\frac{(a(n)\bmod F + C)\bmod F + b(n)\bmod F}{2}\right)\bmod F + F*s\right)\bmod F,$$

where s is equal to [a(m) XOR b(m)] AND [((a(m) XOR a(m−1)) AND ((b(m) XOR b(m−1)].

* * * * *